(12) United States Patent
Cheng et al.

(10) Patent No.: US 7,919,347 B2
(45) Date of Patent: Apr. 5, 2011

(54) METHODS OF FABRICATING P-I-N DIODES, STRUCTURES FOR P-I-N DIODES AND DESIGN STRUCTURE FOR P-I-N DIODES

(75) Inventors: Kangguo Cheng, Guilderland, NY (US); Ramachandra Divakaruni, Ossining, NY (US); Carl John Radens, Lagrangeville, NY (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/349,018

(22) Filed: Jan. 6, 2009

(65) Prior Publication Data
US 2010/0173449 A1 Jul. 8, 2010

(51) Int. Cl.
*H01L 29/868* (2006.01)
(52) U.S. Cl. .... 438/57; 438/702; 257/656; 257/E21.545
(58) Field of Classification Search .................. 438/57, 438/702; 257/656, E21.545
See application file for complete search history.

(56) References Cited

U.S. PATENT DOCUMENTS

| | | | |
|---|---|---|---|
| 6,451,702 B1 * | 9/2002 | Yang et al. | 438/706 |
| 6,538,299 B1 | 3/2003 | Kwark et al. | |
| 6,667,528 B2 | 12/2003 | Cohen et al. | |
| 2005/0133723 A1 * | 6/2005 | Lee et al. | 250/338.4 |
| 2006/0286751 A1 * | 12/2006 | Urakami et al. | 438/272 |
| 2007/0077725 A1 * | 4/2007 | Wilson et al. | 438/427 |
| 2008/0185691 A1 * | 8/2008 | Cheng et al. | 257/656 |

* cited by examiner

*Primary Examiner* — A. Sefer
*Assistant Examiner* — Allen L Parker
(74) *Attorney, Agent, or Firm* — Schmeiser, Olsen & Watts; Anthony J. Canale

(57) ABSTRACT

Methods of fabricating P-I-N diodes, structures for P-I-N diodes and design structure for P-I-N diodes. A method includes: forming a trench in a silicon substrate; forming a doped region in the substrate abutting the trench; growing an intrinsic epitaxial silicon layer on surfaces of the trench; depositing a doped polysilicon layer to fill remaining space in the trench, performing a chemical mechanical polish so top surfaces of the intrinsic epitaxial silicon layer and the doped polysilicon layer are coplanar; forming a dielectric isolation layer in the substrate; forming a dielectric layer on top of the isolation layer; and forming a first metal contact to the doped polysilicon layer through the dielectric layer and a second contact to the doped region the dielectric and through the isolation layer.

9 Claims, 8 Drawing Sheets

METHODS OF FABRICATING P-I-N DIODES, STRUCTURES FOR P-I-N DIODES AND DESIGN STRUCTURE FOR P-I-N DIODES

FIELD OF THE INVENTION

The present invention relates to the field of P-I-N diodes; more specifically, it relates to methods of fabricating P-I-N diodes, structures of P-I-N diodes and design structures for P-I-N diodes.

BACKGROUND OF THE INVENTION

P-I-N diodes are used in such devices as optical sensors, optical receivers and photo-couplers. However, present fabrication methods require multiple photolithographic steps making P-I-N diodes costly because of the number of photomasks required and subject to registration errors between the photomasks of the photolithographic steps. Accordingly, there exists a need in the art to eliminate the deficiencies and limitations described hereinabove.

SUMMARY OF THE INVENTION

A first aspect of the present invention is a method of fabricating a diode, comprising: (a) forming an opening in a hardmask layer on a top surface of a silicon substrate; (b) forming a trench in the silicon substrate in the opening; (c) forming a doped region of a first dopant type in the substrate, the doped region abutting sidewalls and a bottom of the trench; after (c), (d) growing an intrinsic epitaxial silicon layer on the sidewalls and the bottom of the trench, the intrinsic epitaxial silicon later not filling the trench; after (d), (e) depositing a doped polysilicon layer to fill remaining space in the trench, the doped polysilicon layer doped a second dopant type, the second dopant type different from the first dopant type; after (e), (f) performing a chemical mechanical polish, after the chemical-mechanical-polish, top surfaces of the intrinsic epitaxial silicon layer and the doped polysilicon layer and the hardmask layer are coplanar; after (f), (g) forming a dielectric isolation layer in the substrate, the isolation layer completely covering the doped region and the intrinsic epitaxial silicon layer and covering a less than whole portion of the doped polysilicon layer, after the forming the isolation layer, a new top surface of the doped region and a new top surface of the intrinsic epitaxial silicon layer are coplanar; after (g), (h) forming a dielectric layer on top of the isolation layer and the less than whole portion of the doped polysilicon layer not covered by the isolation layer; and after (h), (i) forming a first metal contact to the doped polysilicon layer and a second contact to the doped region, the first contact extending from a top surface of the dielectric layer to the top surface of the doped polysilicon layer, the second contact extending from a top surface of the dielectric layer, through the isolation layer to the new top surface of the doped region.

A second aspect of the present invention is a method of fabricating a diode, comprising: forming an opening in a hardmask layer on a top surface of a single crystal silicon layer on a buried oxide layer on a substrate; (b) forming a trench in the silicon layer in the opening, the trench extending to the buried oxide layer; (c) forming a doped region of a first dopant type in the silicon layer, the doped region abutting sidewalls and the buried oxide layer; after (c), (d) forming an intrinsic epitaxial silicon layer on the sidewalls of the trench, the intrinsic epitaxial silicon layer not filling the trench, a first region of the buried oxide layer not covered by the epitaxial silicon layer; after (d), (e) depositing a doped polysilicon layer to fill remaining space in the trench, the doped polysilicon layer doped a second dopant type, the second dopant type different from the first dopant type; after (e), (f) performing a chemical mechanical polish, after the chemical-mechanical-polish, top surfaces of the intrinsic epitaxial silicon layer and the doped polysilicon layer and the hardmask layer are coplanar; after (f), (g) forming a dielectric isolation layer in the substrate, the isolation layer completely covering the doped region and the intrinsic epitaxial silicon layer and covering a less than whole portion of the doped polysilicon layer, after the forming the isolation layer, a new top surface of the doped region and a new top surface of the intrinsic epitaxial silicon layer are coplanar; after (g), (h) forming a dielectric layer on top of the isolation layer and the less than whole portion of the doped polysilicon layer not covered by the isolation layer; and after (h), (i) forming a first metal contact to the doped polysilicon layer and a second contact to the doped region, the first contact extending from a top surface of the dielectric layer to the top surface of the doped polysilicon layer, the second contact extending from a top surface of the dielectric layer, through the isolation layer to the new top surface of the doped region.

A third aspect of the present invention is a design structure comprising design data tangibly embodied in a machine readable medium, the design data being used for designing, manufacturing, or testing an integrated circuit, the design data comprising information describing a diode, the diode comprising: a completely filled trench in a single crystal silicon layer; a doped region of a first dopant type in the silicon layer, the doped region abutting sidewalls of the trench; an intrinsic epitaxial silicon layer on the sidewalls of the trench, the intrinsic epitaxial silicon later not completely filling the trench; a doped epitaxial silicon layer on the intrinsic epitaxial silicon layer, the doped epitaxial layer doped a second dopant type, the second dopant type different from the first dopant type, the doped epitaxial silicon layer not completely filling the trench; a doped polysilicon layer filling remaining space in the trench, the doped polysilicon layer doped the second dopant type; a dielectric isolation layer in the silicon layer, the isolation layer completely covering the doped region, the intrinsic epitaxial silicon layer, the doped epitaxial silicon layer and covering a less than whole portion of the doped polysilicon layer, top surfaces of the doped region the intrinsic epitaxial silicon layer and the doped epitaxial silicon layer coplanar; a dielectric layer on top of the isolation layer and the less than whole portion of the doped polysilicon layer not covered by the isolation layer; and a first metal contact to the doped polysilicon layer and a second contact to the doped region, the first contact extending from a top surface of the dielectric layer to the top surface of the doped polysilicon layer, the second contact extending from a top surface of the dielectric layer, through the isolation layer to the new top surface of the doped region.

A fourth aspect of the present invention is a diode, comprising: a completely filled trench in a single crystal silicon layer; a doped region of a first dopant type in the silicon layer, the doped region abutting sidewalls of the trench; an intrinsic epitaxial silicon layer on the sidewalls of the trench, the intrinsic epitaxial silicon later not completely filling the trench; a doped epitaxial silicon layer on the intrinsic epitaxial silicon layer, the doped epitaxial layer doped a second dopant type, the second dopant type different from the first dopant type, the doped epitaxial silicon layer not completely filling the trench; a doped polysilicon layer filling remaining space in the trench, the doped polysilicon layer doped the second dopant type; a dielectric isolation layer in the silicon layer, the isolation layer completely covering the doped region, the intrinsic epitaxial silicon layer, the doped epitaxial silicon layer and covering a less than whole portion of the doped polysilicon layer, top surfaces of the doped region the intrinsic epitaxial silicon layer and the doped epitaxial silicon layer coplanar; a dielectric layer on top of the isolation layer and the less than whole portion of the doped polysilicon layer not covered by the isolation layer; and a first metal contact to the doped polysilicon layer and a second contact to the doped region, the first contact extending from a top surface of the dielectric layer to the top surface of the doped polysilicon layer, the second contact extending from a top surface of the dielectric layer, through the isolation layer to the new top surface of the doped region.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 1A through 1J are cross-sections illustrating fabrication of P-I-N diodes according to embodiments of the present invention.

DETAILED DESCRIPTION OF THE INVENTION

P-I-N diodes are diodes having a P-doped silicon region (P) and an N-doped silicon region (N) separated by an intrinsic silicon region (I). The intrinsic region of a P-I-N diode need not be truly intrinsic as long as the resistivity of the region is high. For the purposes of describing and claiming the embodiments of the present invention, an intrinsic silicon region is defined as a silicon region having a P or N dopant concentration of about 1E14 dopant atoms/cm$^3$ or less. Photons striking the intrinsic silicon region generate electron-hole pairs. Holes are collected in the P-doped silicon region and electrons are collected in the N-doped region. A ground contact is made to the P-doped silicon region and a $V_{BIAS}>0$ contact us made to the N-doped silicon region. The voltage on the $V_{BIAS}$ contact is a function of the photon flux striking the intrinsic silicon region.

Figure 1A:
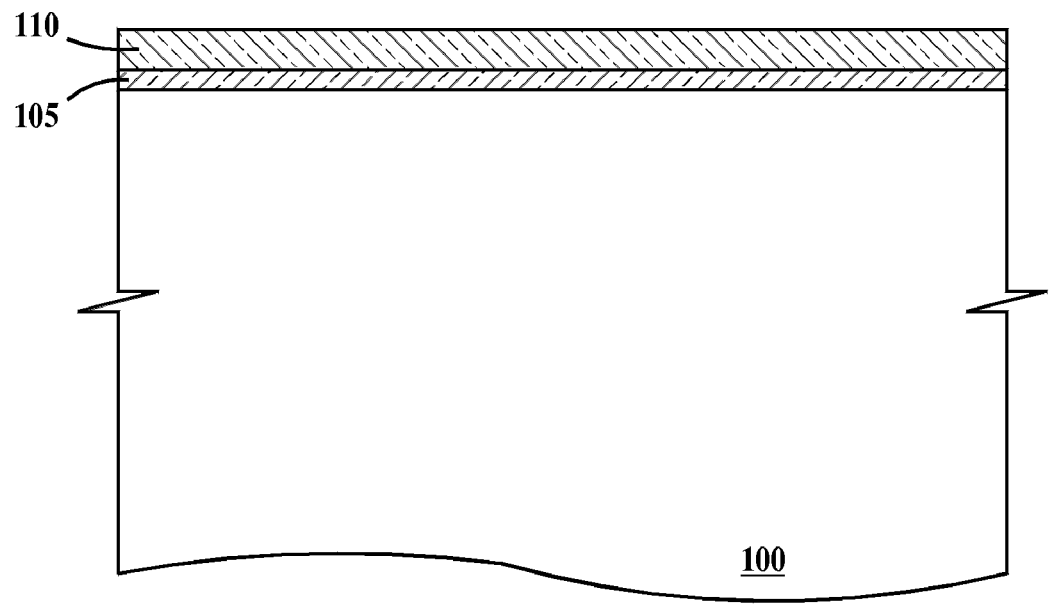

FIGS. 1A through 1J are cross-sections illustrating fabrication of P-I-N diodes according to embodiments of the present invention. In FIG. 1A, formed on a bulk single-crystal silicon substrate 100 is a first pad layer 105. A second and optional pad layer 110 is formed on first pad layer 110. When one pad layer is present, in one example, first pad layer 105 is silicon nitride. When two pad layers are present, in one example, first pad layer 105 is silicon dioxide and second pad layer 110 is silicon nitride.

Figure 1B:
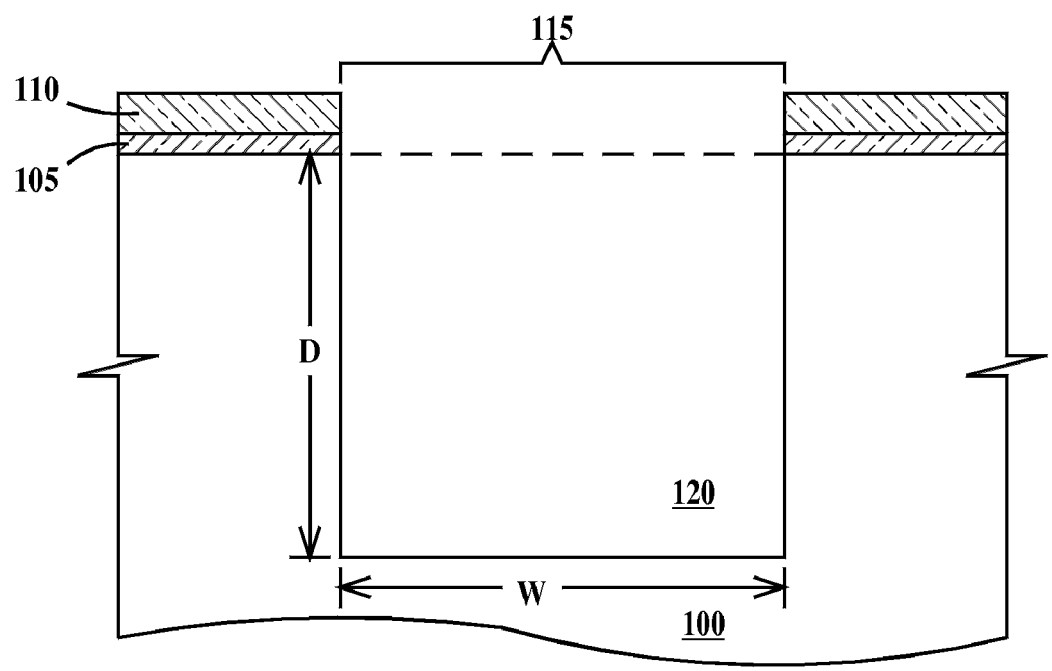

In FIG. 1B, a photolithographic process (e.g., apply a photoresist layer to a layer, expose the photoresist layer to actinic radiation through a patterned photo mask, develop the pattern exposed into the photoresist layer, etch the layer where not covered by photoresist, and remove the patterned photoresist layer) is used to define an opening 115 in pad layers 105 and 110. A trench 120 is etched into substrate 100 using pad layers 105 and 110 as a hardmask. In one example opening 115 and trench 120 are etched using a reactive ion etch (RIE) process. Trench 120 has a depth D and a width W. In one example D is between about 8 microns and about 10 microns. In one example W is between about 45 nm about 190 nm. The value of W can be varied to select the wavelength of light absorbed by the intrinsic region (see element 130 of FIG. 1D). W should be between about $1/\alpha$ and about $2/\alpha$ where $\alpha$ is the absorption coefficient of silicon and varies as a function of incident wavelength.

Figure 1C:
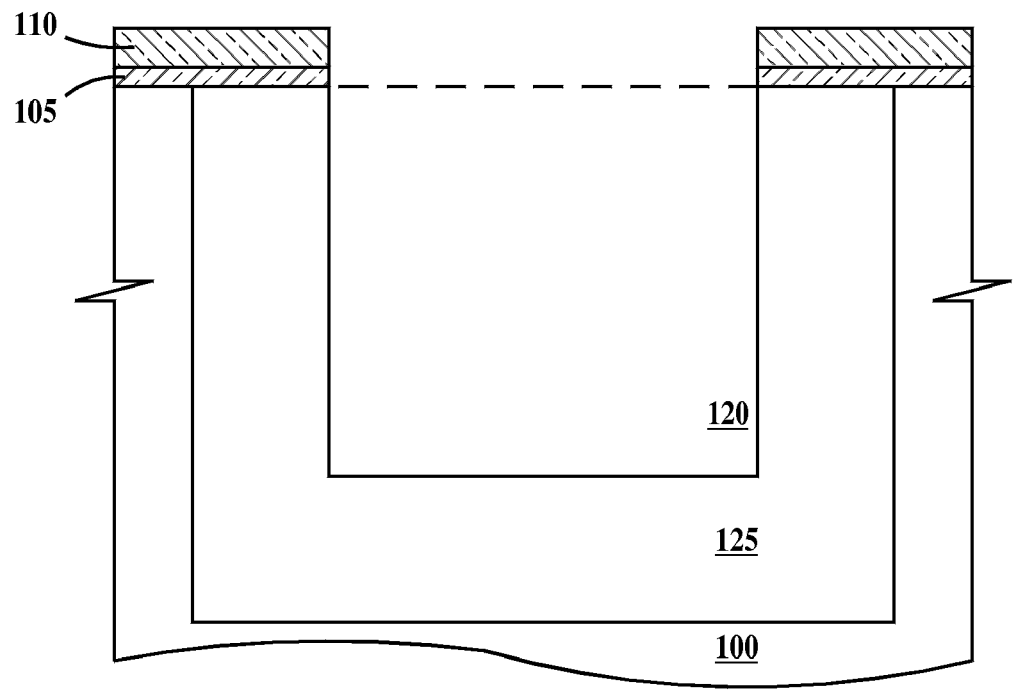

In FIG. 1C, a doped region 125 is formed in substrate 100 around trench 120. Alternatively, doped region 125 may be formed prior to forming trench 120 and trench 120 then etched into the doped region. In one example, doped region is formed by ion implantation of a doping species through a patterned photoresist layer.

Figure 1D:
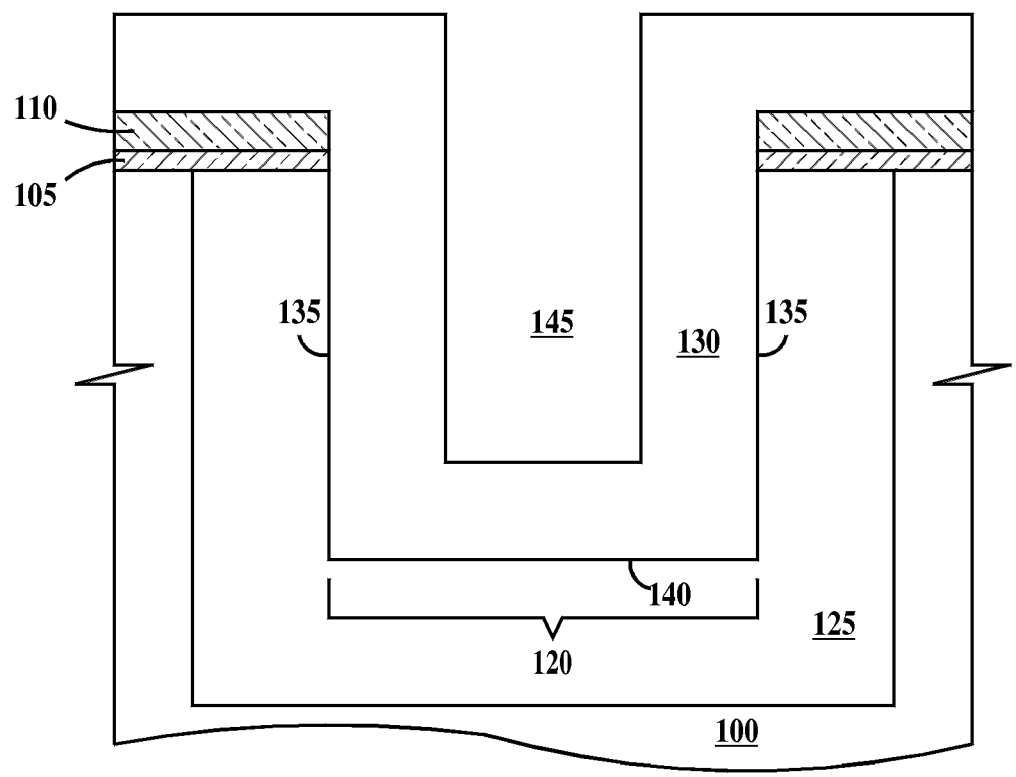

In FIG. 1D, an intrinsic epitaxial silicon layer 130 is grown on the sidewalls 135 and bottom 140 of trench 120. Layer 130 does not completely fill trench 120, leaving a trench 145 within trench 120. An epitaxial silicon layer is a silicon layer that has the same crystal orientation as the underlying silicon layer. A process that grows an epitaxial layer is an epitaxial process. Intrinsic epitaxial silicon layer 130 may have an N- or P dopant concentration of about 1E14 dopant atoms/cm$^3$ or less.

Figure 1E:
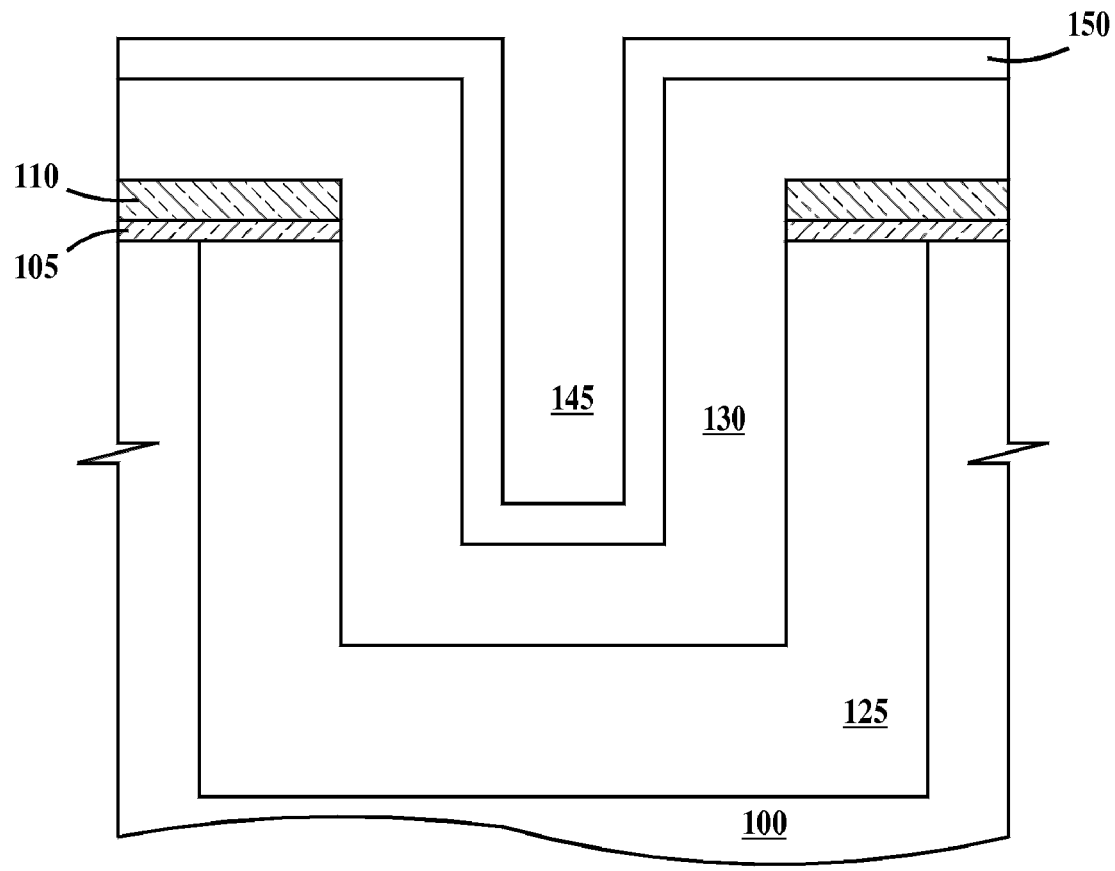

In FIG. 1E, an optional doped epitaxial silicon layer 150 is grown on the exposed surface of intrinsic epitaxial silicon layer 130. Layer 150 does not completely fill trench 145. Layer 150 is doped the opposite type from the doping type of region 125.

Figure 1F:
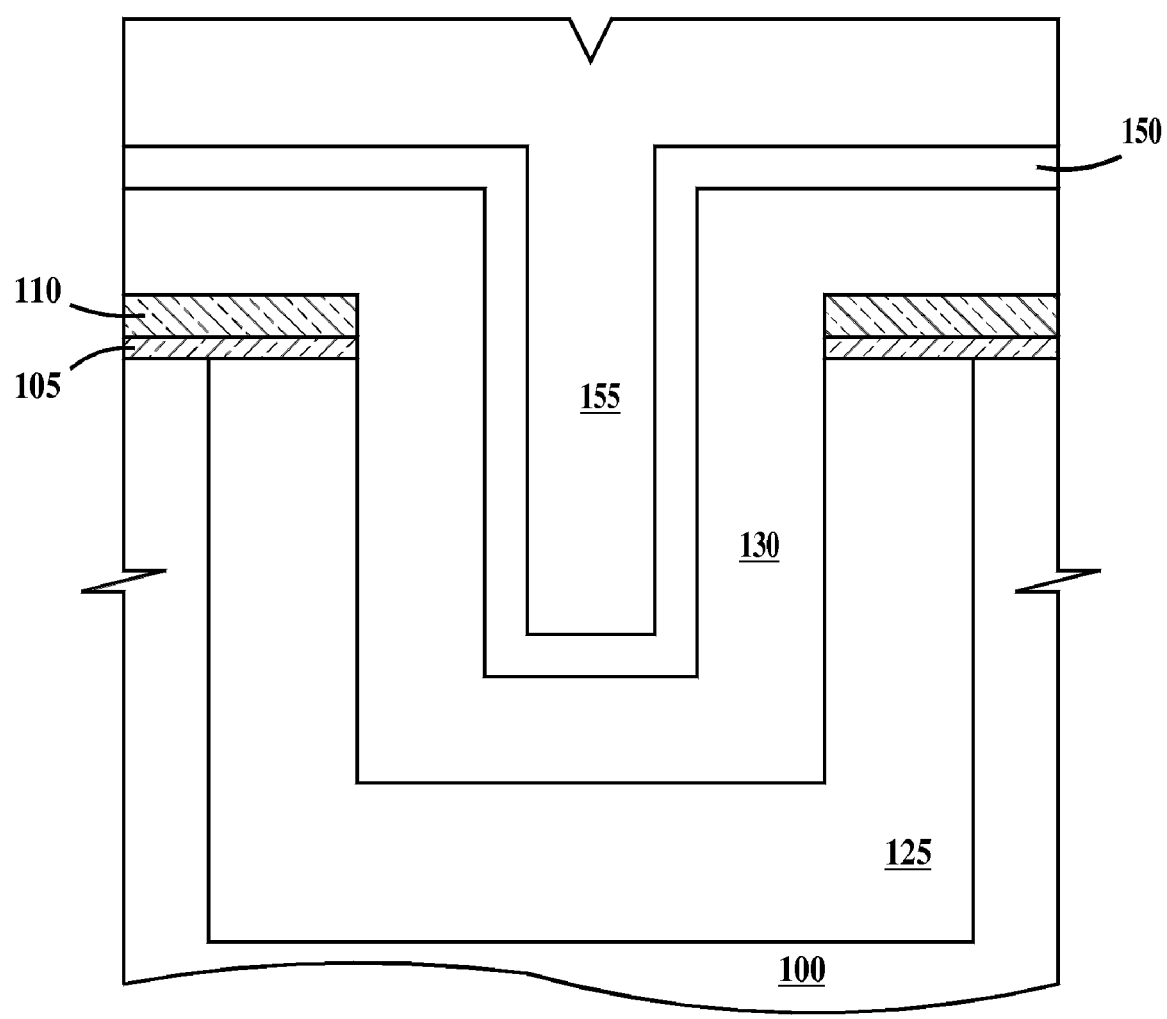

In FIG. 1F, a doped polysilicon layer 155 is formed on optional layer 150, if present) or on layer 130 if layer optional layer 150 is not present. Layer 155 completely fill remaining space in trench 145 (see FIG. 1E). Layer 155 is doped the same type as optional layer 150 (if present). Layer 155 is doped the opposite type from the doping type of region 125. In P-I-N diodes including optional layer 150 the layers 150/130 interface will be less leaking than the layers 155/130 interface is in P-I-N diodes not using optional layer 150.

Figure 1G:
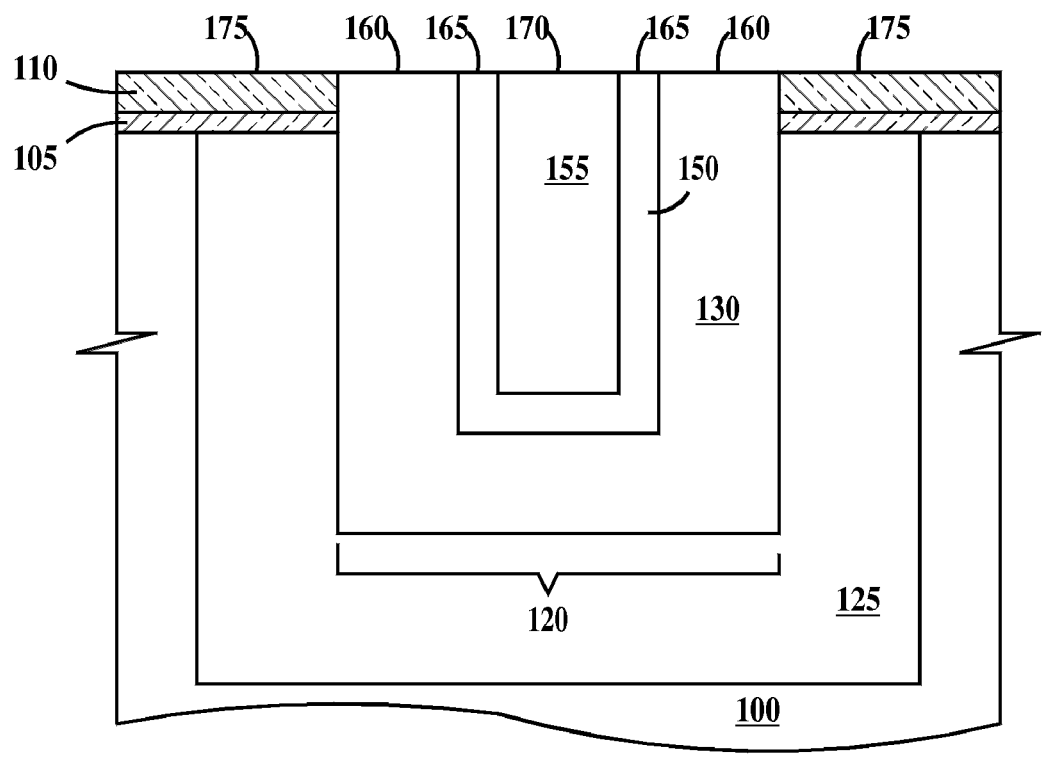

In FIG. 1G, a chemical-mechanical-polish (CMP) process has been performed so a top surface of 160 of layer 130, a top surface 165 of layer 150 and a top surface 170 of layer 155 in trench 120 are coplanar with a top surface 175 of second pad layer 110 (or a top surface of first pad layer 105 if the second pad layer is not present).

Figure 1H:
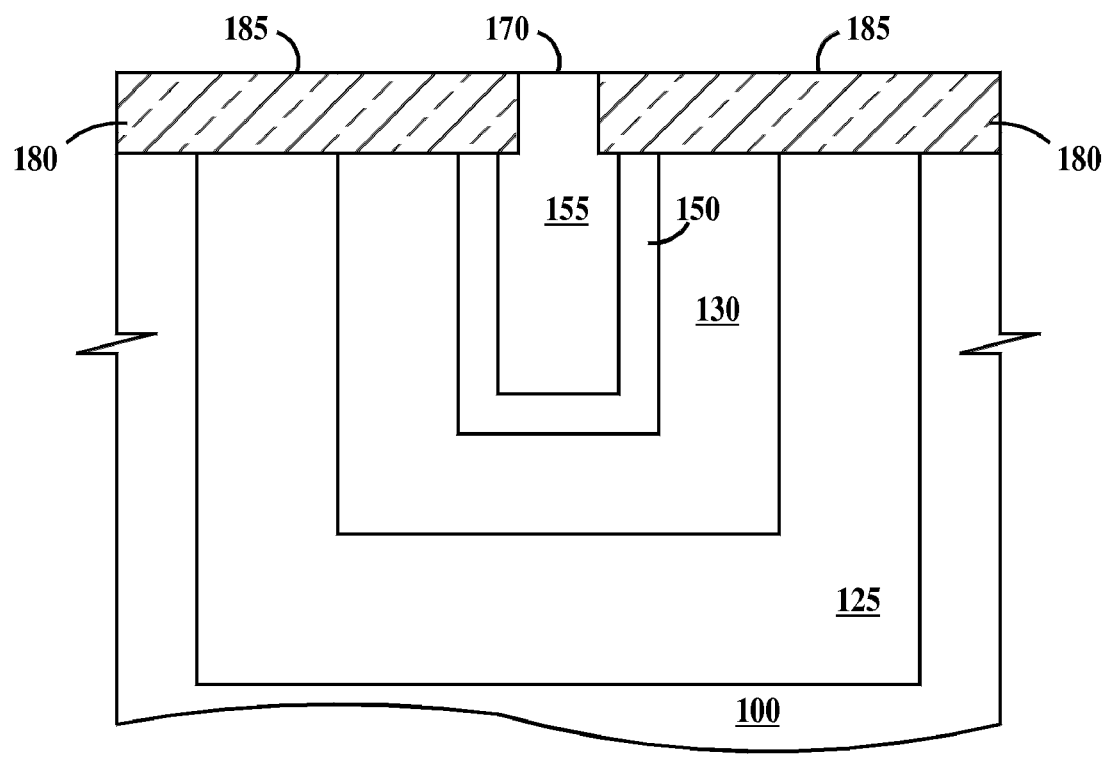

In FIG. 1H, pad layers 105 and 110 of FIG. 1G are have been used as a hardmask to define a dielectric shallow trench isolation (STI) 180 and are no longer present in FIG. 1H. An STI process includes photolithographically defining an opening in a hardmask layer (e.g., the pad layers), etching (e.g., RIE) a trench into the underlying silicon and depositing a dielectric (e.g., silicon diode) to fill the trench, followed by a CMP to planarize the surface. In FIG. 1H, a top surface 185 of STI 180 is coplanar with top surface 170 of layer 155. STI 180 covers layers 125, 130 and 150 (if present) and regions of layer 155.

Figure 1J:
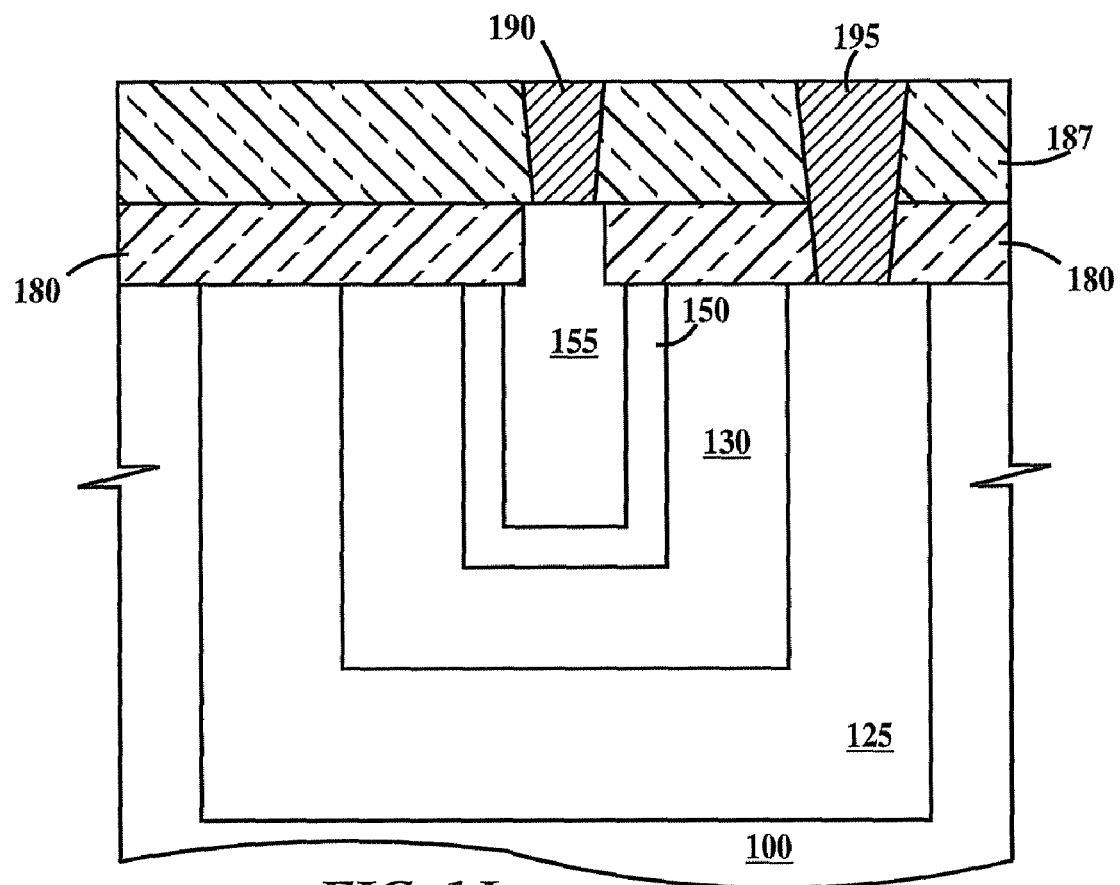

In FIG. 1J, a dielectric layer 187 (e.g., a layer of silicon dioxide) is formed on top of ST 180 and exposed surfaces of layer 155 and a first contact 190 is formed through dielectric 187 to layer 155 and a second contact 195 is formed through dielectric layer 187 and STI 180 to layer 125. In one example, contacts 190 and 195 are metal. In one example, contacts 190 and 195 are both tungsten, aluminum or copper.

Figure 2:
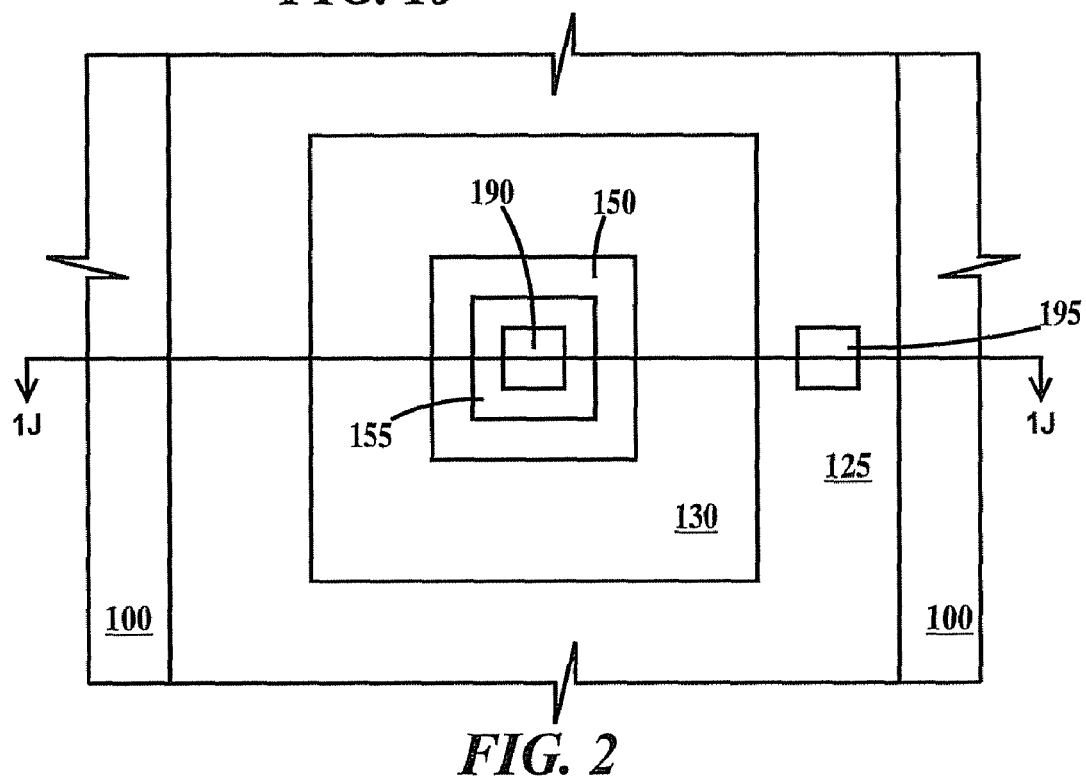
FIG. 2 is a top view of the P-I-N diode of FIG. 1J.

FIG. 2 is a top view of the P-I-N diode of FIG. 1J. FIG. 1J is a section through line 1J-1J of FIG. 2. It can be seen in FIG. 2, that layer 155 is surrounded by layer 150, layer 150 is surrounded by layer 130 and layer 130 is surrounded by region 125. In one example, region 125 is doped N type and regions 150 and 155 are doped P-type. In one example, region 125 is doped P type and regions 150 and 155 are doped N-type. In one example, a dopant concentration of region 125 is between about 1E19 atm/cm$^3$ and about 1E20 atm/cm$^3$. In one example, a dopant concentration of layer 150 is between about 1E19 atm/cm$^3$ and about 1E20 atm/cm$^3$. In one example, a dopant concentration of layer 155 is greater than about 1E19 atm/cm$^3$.

Figure 3:
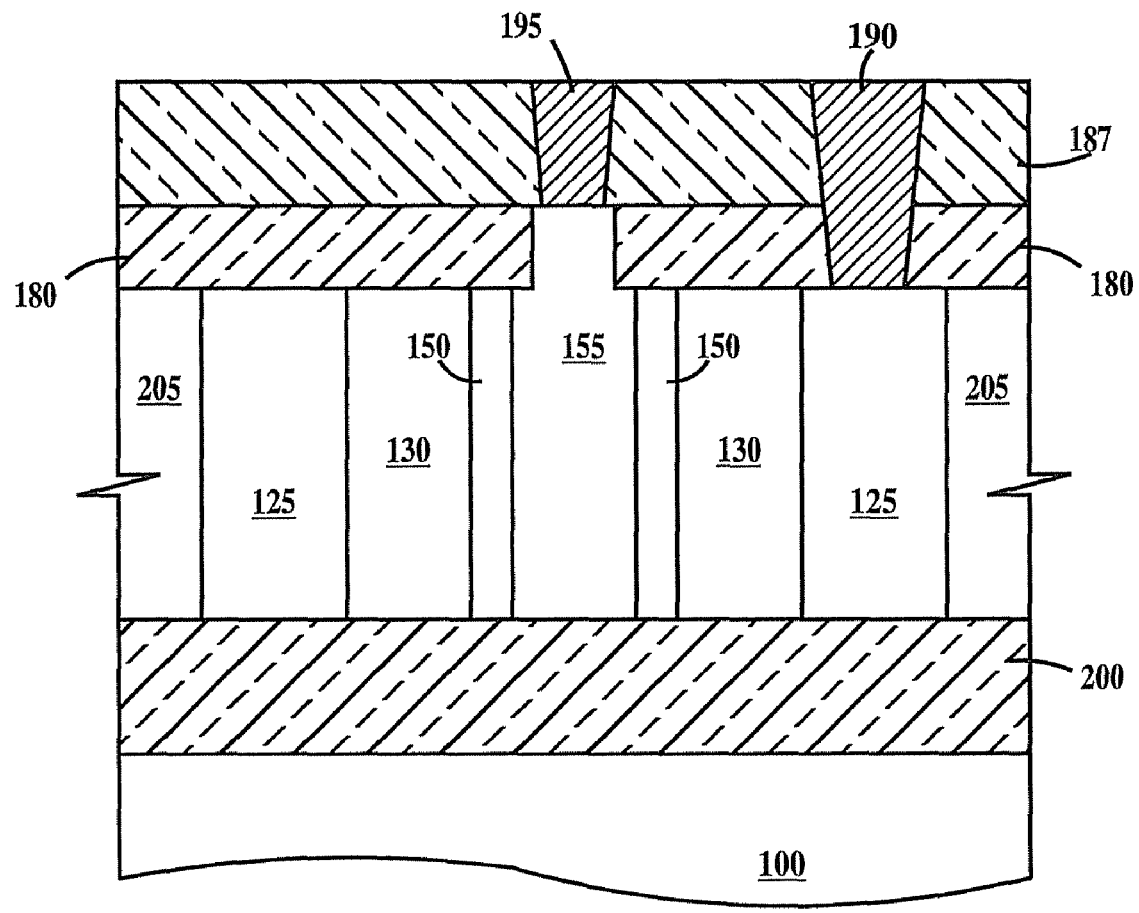
FIG. 3 is a cross-section of a P-I-N diode fabricated using an SOI substrate.

FIG. 3 is a cross-section of a P-I-N diode fabricated using an SOI substrate. In FIG. 3, a buried (silicon) oxide layer (BOX) 200 separated a single crystal silicon layer 205 from substrate 100. In FIG. 3, region 125 and layers 130, 150 and 155 have been formed in silicon layer 205. The fabrication process of the P-I-N diode of FIG. 1J and that of FIG. 2 are similar. In fabricating the P-I-N diode of FIG. 2, trench 120 (see FIG. 1B) is etched to expose BOX layer 200 in the bottom of the trench. Two additional fabrication steps are added to form the structure of FIG. 2. After forming layer 130, an RIE is performed leaving layer 130 on the sides of the trench and exposing BOX layer 200. After forming layer 150, an RIE is performed leaving layer 150 on layer 130 and exposing BOX layer 200.

It should be clear from the description supra, that only one photomask defines the extent of the P-doped, Intrinsic and N-doped elements of P-I-N diodes according to embodiments of the present invention and that the P-doped, Intrinsic and N-doped elements of P-I-N diodes according to embodiments of the present invention are self aligned.

Figure 4:
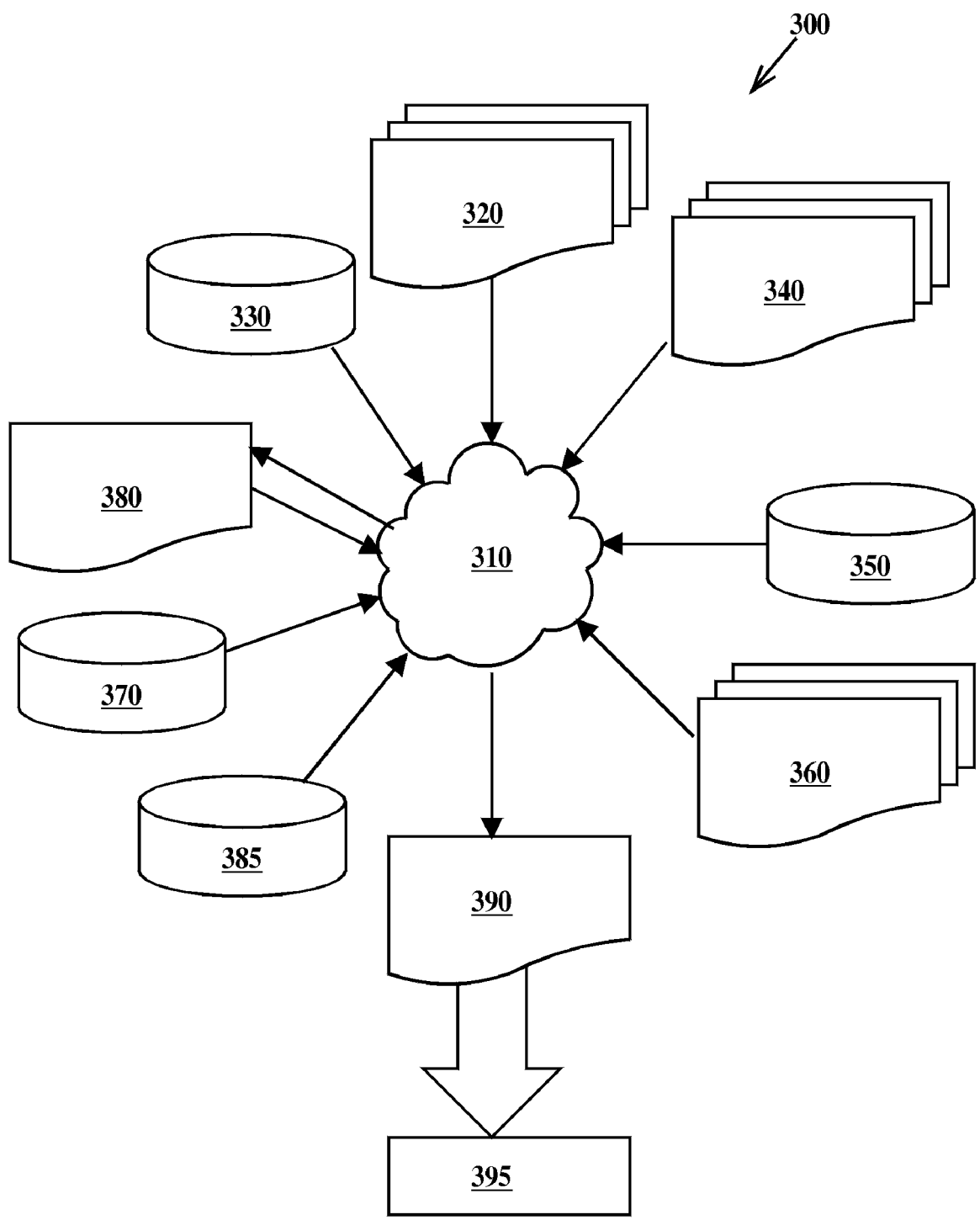
FIG. 4 is shows a block diagram of an exemplary design flow used for example, in semiconductor IC logic design, simulation, test, layout, and manufacture.

FIG. 4 shows a block diagram of an exemplary design flow 300 used for example, in semiconductor IC logic design, simulation, test, layout, and manufacture. Design flow 300 includes processes and mechanisms for processing design structures or devices to generate logically or otherwise functionally equivalent representations of the design structures and/or devices described above and shown in FIGS. 1J, 2 and 3. The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 320 that is preferably processed by a design process 310. In one embodiment, the design structure 320 comprises design data used in a design process and comprising information describing an embodiment of the invention with respect to P-I-N diodes as shown in FIGS. 1J, 2 and 3. The design data in the form of schematics or HDL, a hardware-description language (e.g., Verilog, VHDL, C, etc.) may be embodied on one or more machine readable media. For example, design structure 320 may be a text file, numerical data or a graphical representation of an embodiment of the invention as shown in FIGS. 1J, 2 and 3. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer. When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, or system such as those shown in FIGS. 1J, 2 and 3. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or logic structures shown in FIGS. 1J, 2 and 3 to generate a netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 310 may include hardware and software modules for processing a variety of input data structure types including netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 310 without deviating from the scope and spirit of the invention. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures along with any additional mechanical design or data (if applicable), to generate a second design structure 390 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1J, 2 and 3. In one embodiment, design structure 390 may comprise a compiled, executable HDL simulation model that functionally simulates the devices shown in FIGS. 1J, 2 and 3.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1J, 2 and 3. Design structure 390 may then proceed to a stage 395 where, for example, design structure 390: proceeds to tape-out, is released to manufacturing, is released to a mask house, is sent to another design house, is sent back to the customer, etc.

Thus the embodiments of the present invention provide methods of fabricating P-I-N diodes, structures for P-I-N diodes and design structure for P-I-N diodes that require only one photomask to define the extent of the P-doped, Intrinsic and N-doped elements of P-I-N diodes and that the P-doped, Intrinsic and N-doped elements of P-I-N diodes according to embodiments of the present invention are self aligned.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of fabricating a diode, comprising the steps of:
   (a) forming an opening in a hardmask layer on a top surface of a silicon substrate;
   (b) forming a trench in said silicon substrate in said opening;
   (c) forming a doped region of a first dopant type in said substrate, said doped region abutting sidewalls and a bottom of said trench;
   (d) growing an intrinsic epitaxial silicon layer on said sidewalls and said bottom of said trench, said intrinsic epitaxial silicon later not completely filling said trench;
   (e) depositing a doped polysilicon layer after (d) to fill remaining space in said trench, said doped polysilicon layer doped a second dopant type, said second dopant type different from said first dopant type;
   (f) performing a chemical mechanical polish, after said chemical-mechanical-polish, top surfaces of said intrinsic epitaxial silicon layer and said doped polysilicon layer and said hardmask layer are coplanar;
   (g) forming, after (f), a dielectric isolation layer in said substrate, said isolation layer completely covering said doped region intrinsic epitaxial silicon layer, and a less than whole portion of said doped polysilicon layer and not covering a second less than whole portion of said doped polysilicon layer,
   after said forming said isolation layer, a new top surface of said doped region and a new top surface of said intrinsic epitaxial silicon layer are coplanar;
   (h) forming a dielectric layer on top of said isolation layer and said second less than whole portion of said doped polysilicon layer not covered by said isolation layer; and
   (i) forming, after(h), a first metal contact to said doped polysilicon layer and
   a second contact to said doped region,
   said first contact extending from a top surface of said dielectric layer to said top surface of said doped polysilicon layer,
   said second contact extending from a top surface of said dielectric layer, through said isolation layer to said new top surface of said doped region.

2. The method of claim 1 (see the rejection of claim 1 above), further including:
   between (d) and (e), growing a doped epitaxial silicon layer on said intrinsic epitaxial silicon layer;
   said doped polysilicon layer is formed on said doped epitaxial silicon layer;
   wherein a top surface of said doped epitaxial silicon layer is coplanar with said top surface of said intrinsic epitaxial silicon layer after (e); and
   wherein, after(g), a new top surface of said doped epitaxial silicon layer is coplanar with said new top surface of said intrinsic epitaxial silicon layer and
   said isolation layer covers said doped epitaxial silicon layer.

3. The method of claim 2, wherein said doped region is doped N-type and said doped epitaxial silicon layer and said doped polysilicon layer are both doped P-type.

4. The method of claim 2, wherein said doped region is doped P-type and said doped epitaxial silicon layer and said doped polysilicon layer are both doped N-type.

5. The method of claim 1, wherein (b) is performed before (c).

6. The method of claim 1, wherein (b) is performed after (c).

7. The method of claim 1, wherein said doped region is doped N-type and said doped polysilicon layer is doped P-type.

8. The method of claim 1, wherein said doped region is doped P-type and said doped polysilicon layer is doped N-type.

9. The method of claim 1, further including:
   selecting a wavelength of light said diode is responsive to by selecting a width of said trench formed in (b).

* * * * *